(12) United States Patent
Jensen et al.

(10) Patent No.: US 6,556,440 B2
(45) Date of Patent: Apr. 29, 2003

(54) DISHRACK SHROUD FOR SHIELDING AND COOLING

(75) Inventors: Ralph W. Jensen, Austin, TX (US); Mark M. Bailey, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 96 days.

(21) Appl. No.: 09/915,714

(22) Filed: Jul. 26, 2001

(65) Prior Publication Data

US 2003/0021088 A1 Jan. 30, 2003

(51) Int. Cl.[7] .................................................. H05K 7/20
(52) U.S. Cl. ..................... 361/687; 361/695; 361/697; 165/121
(58) Field of Search ...................... 361/687, 680–686, 361/724, 727, 695, 697, 689–690; 165/121, 80.3

(56) References Cited

U.S. PATENT DOCUMENTS

| | | | |
|---|---|---|---|
| 5,321,581 A | 6/1994 | Bartilson et al. | ........... 361/695 |
| 5,575,403 A | 11/1996 | Mills | ........................... 361/687 |
| 5,597,035 A | 1/1997 | Smith et al. | ................. 361/697 |
| 5,640,046 A | 6/1997 | Suzuki et al. | ................ 257/714 |
| 5,930,112 A * | 7/1999 | Babinski et al. | ............ 361/695 |
| 5,936,836 A | 8/1999 | Scholder | ..................... 361/695 |
| 6,259,600 B1 * | 7/2001 | Talbot et al. | ................. 36/704 |
| 6,411,506 B1 * | 6/2002 | Hipp et al. | ................. 361/686 |

* cited by examiner

*Primary Examiner*—Darren Schuberg
*Assistant Examiner*—Hung Van Duong
(74) *Attorney, Agent, or Firm*—Haynes and Boone, LLP

(57) ABSTRACT

A computer includes a chassis and a motherboard mounted in the chassis. A baseplate is mounted adjacent the motherboard. A plurality of dividers are mounted on the baseplate and extend therefrom. The dividers are substantially equally spaced apart in a substantially parallel relationship. The baseplate includes a first substantially planar section and a second substantially planar section. The first and second planar sections extend along respective first and second planes. The first plane is spaced apart from the second plane. A ventilated ramp extends between the first and second planar sections. The ramp directs an airflow path from a first side of the first planar section to a second side of the second planar section.

20 Claims, 7 Drawing Sheets

DISHRACK SHROUD FOR SHIELDING AND COOLING

BACKGROUND

The disclosures herein relate generally to computer systems and more particularly to a shroud for protecting against accidental contact between expansion cards and other computer components.

With the need for more hot plugable access to computers there is a corollary need to protect exposed circuits and components, i.e. shield them, in customer access areas. Also, with faster higher power IC's on circuit boards there is a need for improved thermal cooling. One such area is the motherboard at the hotplug PCI cards. Typically, the mechanical shielding aspect is done with a "dishrack" structure: plastic partitions assembled into a custom designed plastic base. To accommodate cooling requirements on the motherboard, holes are provided in the dishrack base. These large holes, typically for heatsinks, often do not allow air to flow into the heatsinks at their base (where airflow is most useful) because the plastic of the dishrack is in the way. Also, the heatsink holes provide more exposure to the motherboard for probing and falling objects, as well as, lessen the robustness and strength of the dishrack. Because there is no precision location for most heatsinks, these holes must be substantially over sized. Also, preheated air from, or to, other computer devices are allowed to mix between the motherboard IC's and feature cards, VRMs, CPU etc.

In one approach, the dishrack base possesses a potentially severe thermal problem by blocking airflow to heatsinks on various high speed components that drive the new 64 bit 66 Mhz SCSI control chip set (Intel 1960 and two SCSI controller chips). These chips generate much more heat than previous chips that controlled the SCSI busses and they reside directly under the hotplug PCI cards. There may also be a number of parts/assemblies that lie in front of these chips: cables, connectors and card guide support structures. Also, these heatsinks are placed upon the SCSI chips by hand with no locating features.

In some present server products there has been a dishrack provided. To provide motherboard component cooling, especially heatsinks, the above-mentioned holes were put into the dishrack base. Another approach is to provide a mylar film that covers the motherboard under the PCI cards, also often provided with holes for heatsinks.

Therefore, what is needed is to provide the mechanical shielding for the motherboard that is required in the PCI hotplug area, but also to precisely control and channel cooling air to motherboard components, especially the SCSI control chip set, and to make the mechanical shielding, or insulation, more effective via a more complete coverage of the motherboard.

SUMMARY

One embodiment, accordingly, provides a protective shroud to protect inserted cards from contacting each other and contacting the motherboard. Also, cooling is enhanced by the shroud. To this end, an apparatus includes a baseplate and a plurality of dividers mounted on the baseplate so as to extend therefrom. The dividers are substantially equally spaced apart in a substantially parallel relationship. The baseplate includes a first substantially planar section and a second substantially planar section. The first and second planar sections extend along respective first and second planes. The first plane is spaced apart from the second plane. A ventilated ramp extends between the first and second planar sections. The ramp directs an airflow path from a first side of the first planar section to a second side of the second planar section.

A principal advantage of this embodiment is that the shroud provides a means for cooling controller chips and also provides more motherboard protection than presently known shrouds.

DETAILED DESCRIPTION

Figure 1:
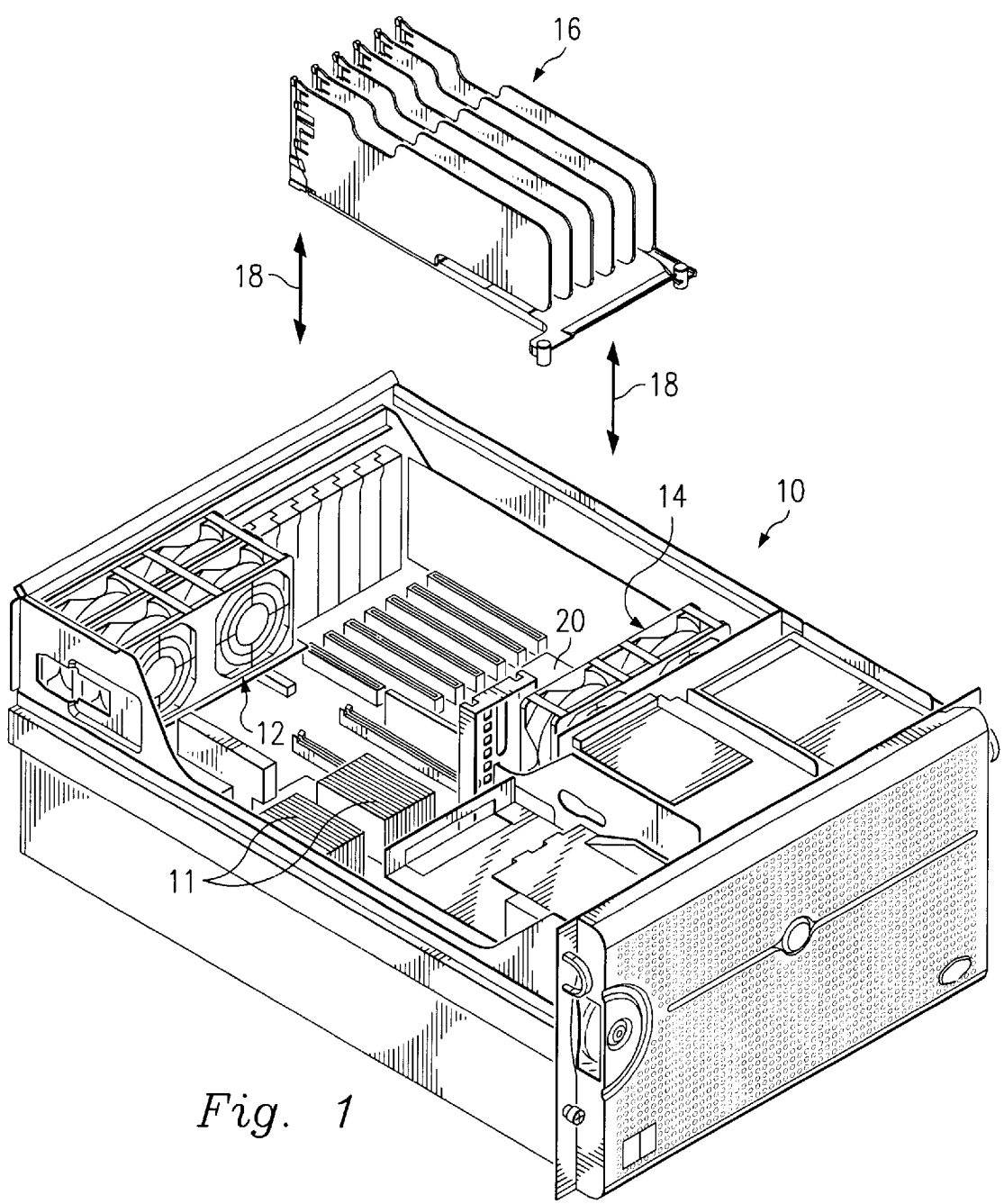
FIG. 1 is a perspective view illustrating an embodiment of a server chassis.
Figure 2:
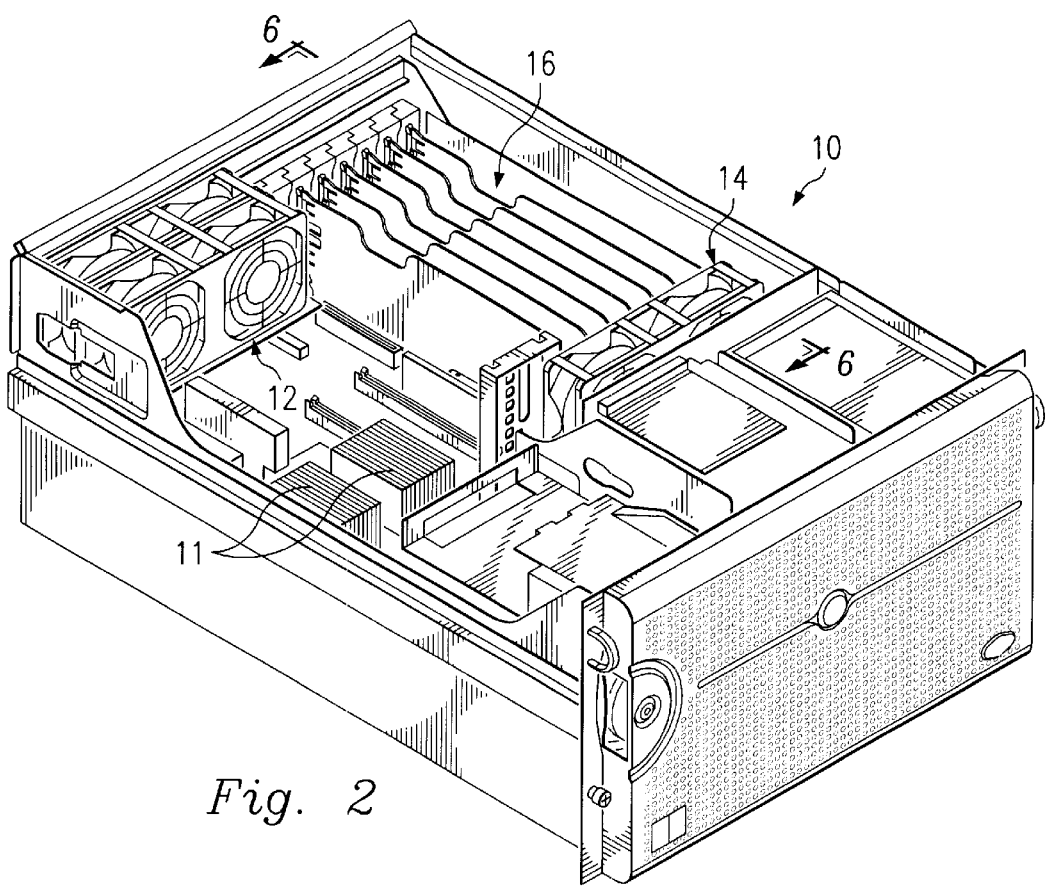
FIG. 2 is another perspective view illustrating an embodiment of the server chassis.

A server chassis is generally designated 10 in FIGS. 1 and 2 and includes a fan assembly 12 for cooling components in the chassis 10 such as, for example, CPU's 11. Another fan assembly 14 is provided for cooling SCSI controller chips 20 and also for cooling PCI cards (to be discussed below in greater detail). Although chassis 10 is described as a server chassis, any electronic housing which requires fan cooling is contemplated.

An apparatus comprising a dishrack shroud 16, is provided to be inserted into and removed from chassis 10, in the directions indicated by bi-directional arrows 18. Shroud 16 provides a means to cool the SCSI controller chips 20, and the PCI cards 22, see FIG. 6.

The shroud 16, FIGS. 3–7, comprises a baseplate 24 and a plurality of dividers 26 mounted on the baseplate 24. Dividers 26 extend from the baseplate 24 and are substantially equally spaced apart in a substantially parallel relationship.

Baseplate 24 includes a first substantially planar section 24a and a second substantially planar section 24b, which extend along first and second planes P1, P2, respectively, such that the first plane P1 is spaced apart from the second plane P2 by a distance S. A ventilated ramp 28 extends between the first planar section 24a and the second planar section 24b.

Figure 3:
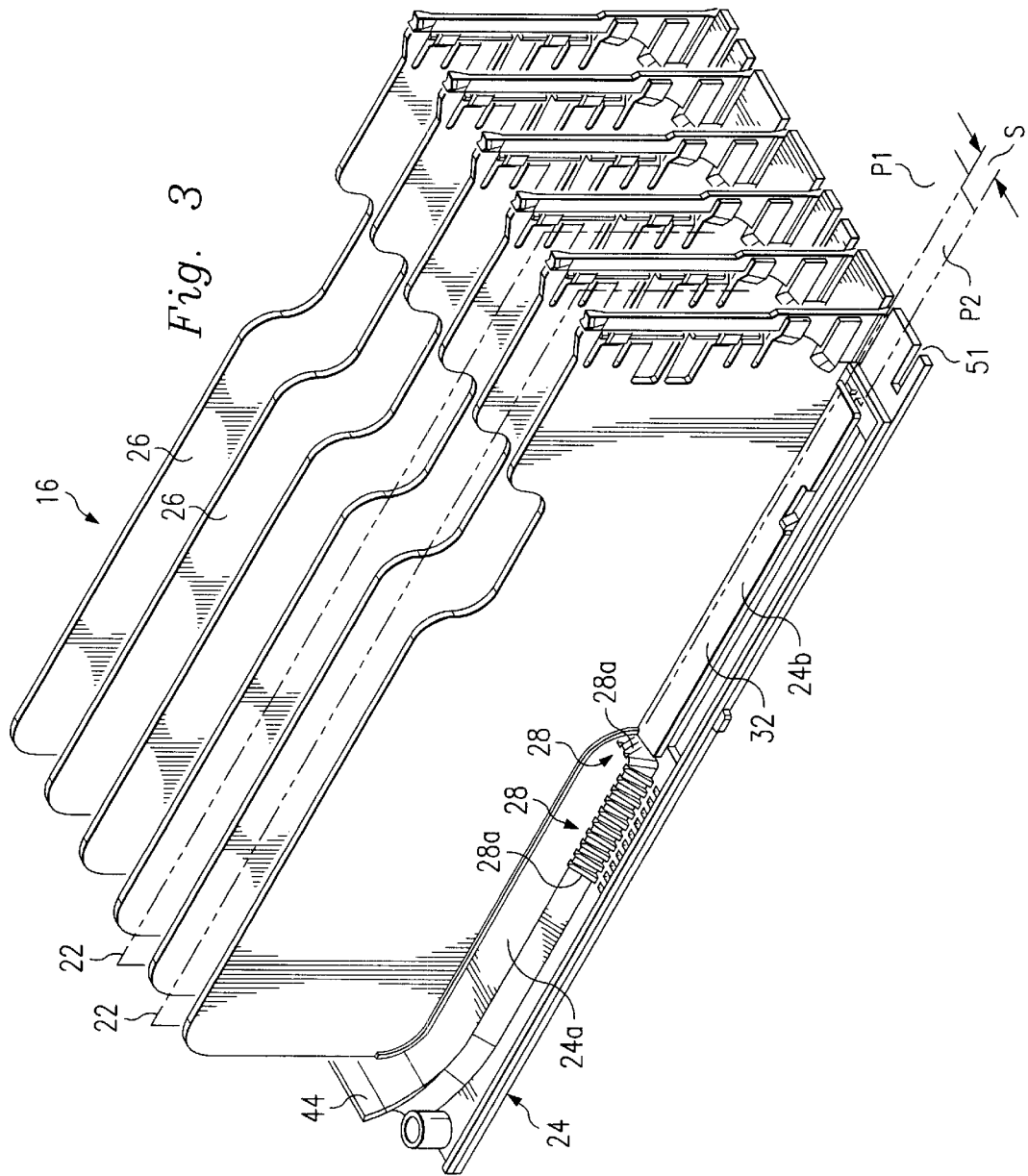
FIG. 3 is a perspective view illustrating an embodiment of a dishrack shroud.
Figure 4:
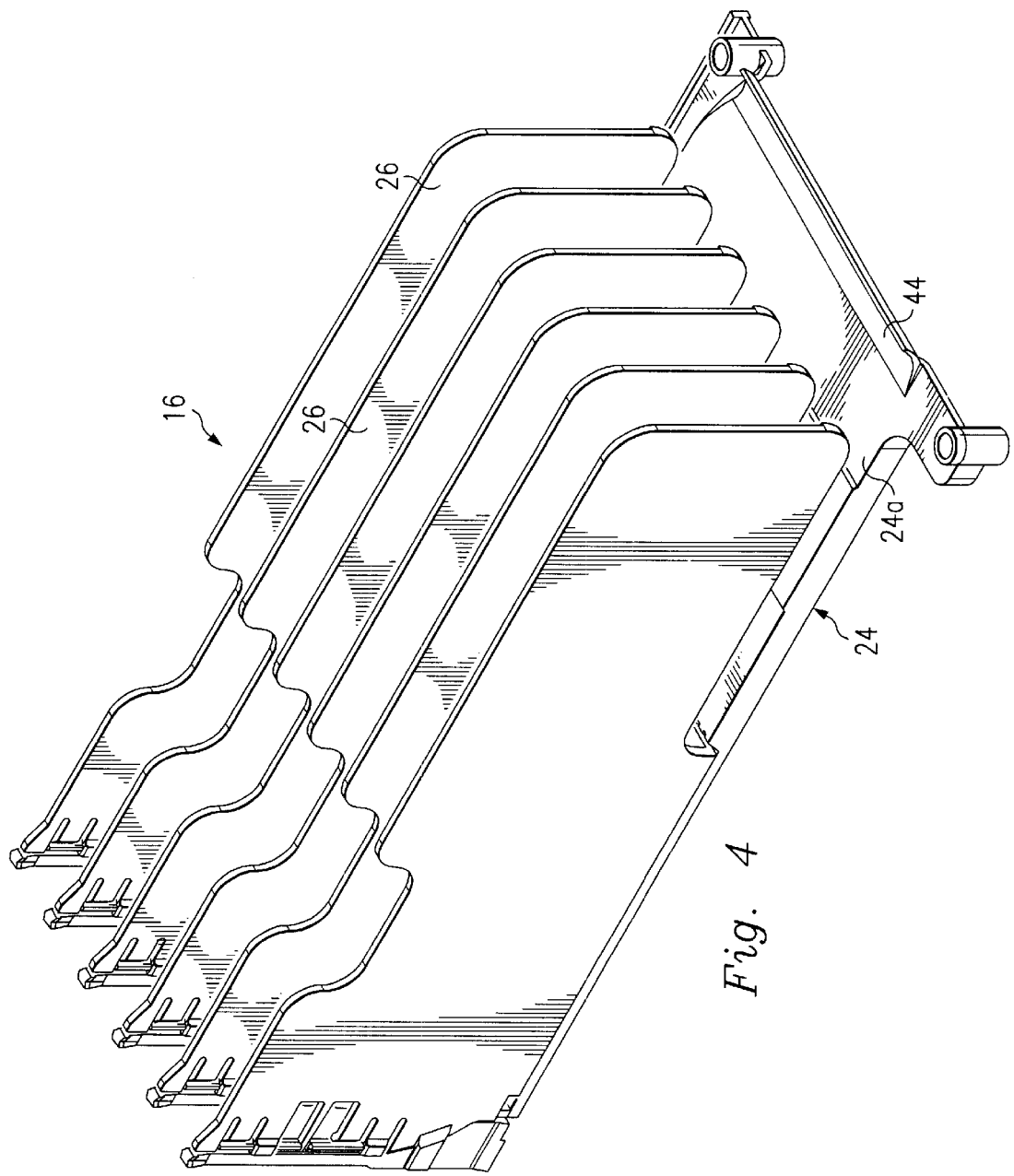
FIG. 4 is another perspective view illustrating a reverse view the shroud of FIG. 3.
Figure 5:
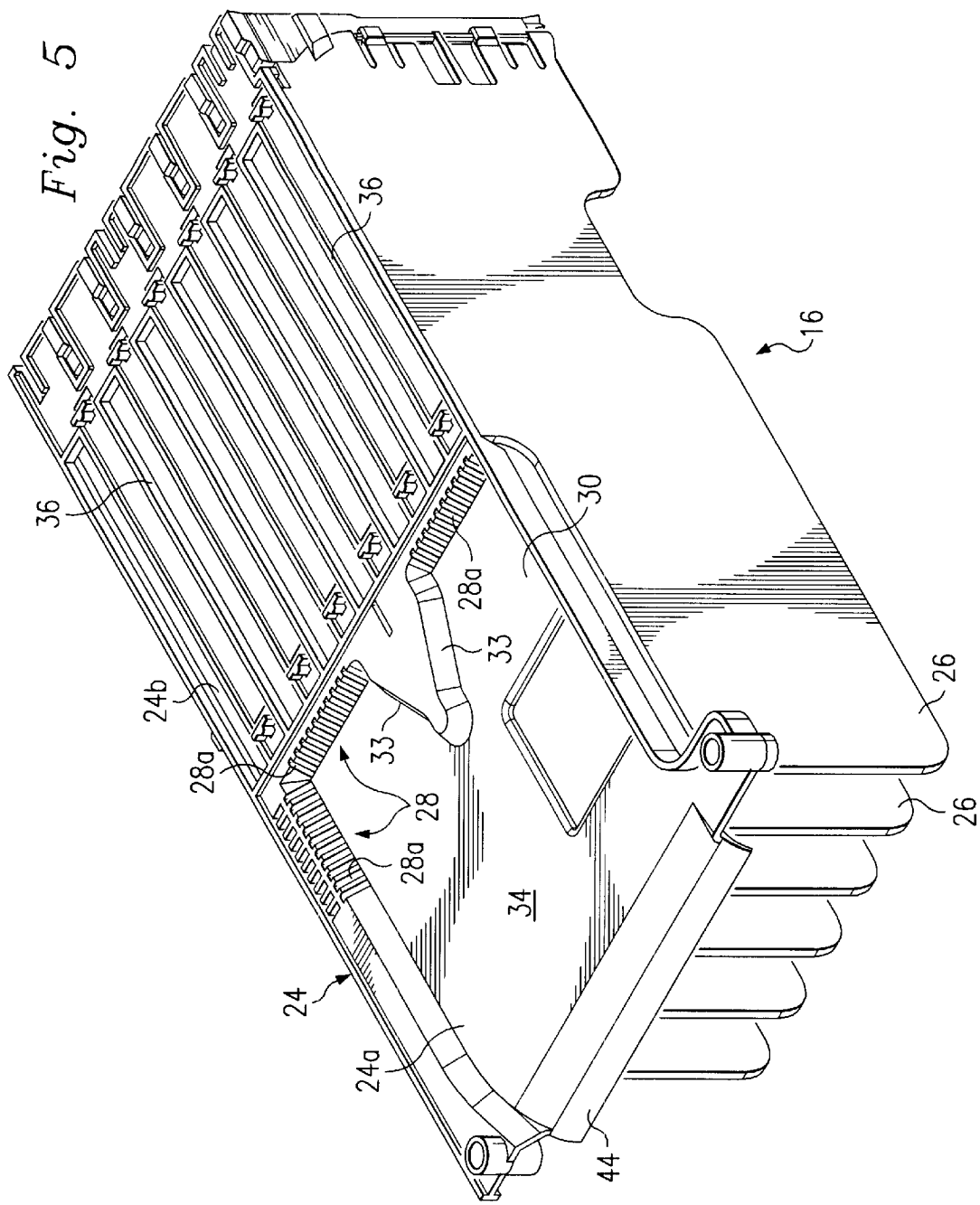
FIG. 5 is another perspective view illustrating an inverted view of the shroud in FIGS. 3 and 4.

The ramp 28 directs an airflow path from a first side 30, FIG. 5, of the first planar section 24a to a second side 32, FIG. 3, of the second planar section 24b.

The first planar section 24a, FIG. 5, includes an enlarged planar area 34 free of any openings formed therein for forming an air manifold to be discussed below in greater detail. The second planar section 24b includes a plurality of elongated, substantially parallel connector slots 36 formed therein. The ventilated ramp 28 is an inclined section which interconnects the first planar section 24a and the second planar section 24b. A plurality of openings or slots 28a are formed in ramp 28. A plurality of walls 33, FIGS. 5 and 7, form channels to direct airflow to the SCSI chips 20.

Figure 6:
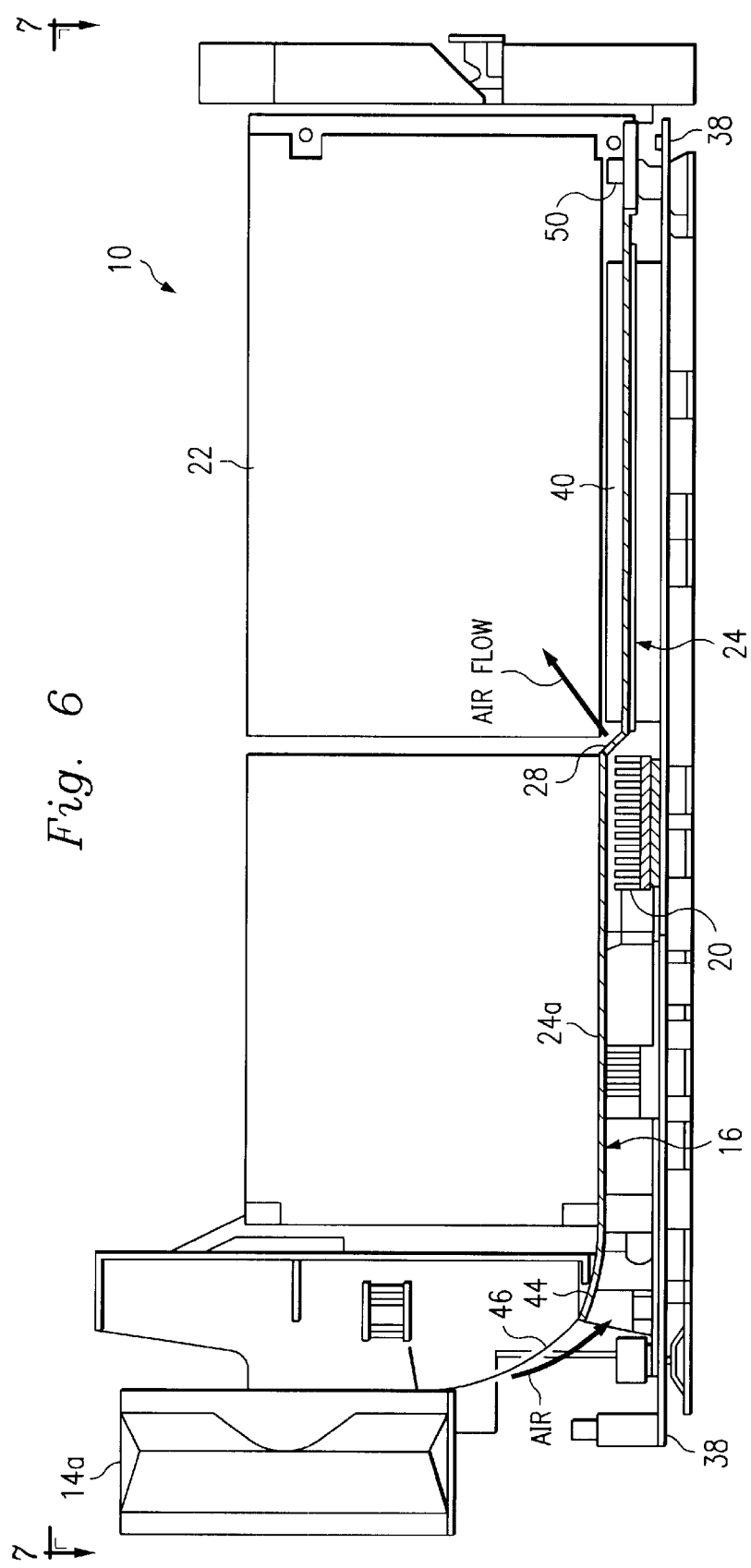
FIG. 6 is side elevation view taken along the line 6—6 of FIG. 2.
Figure 7:
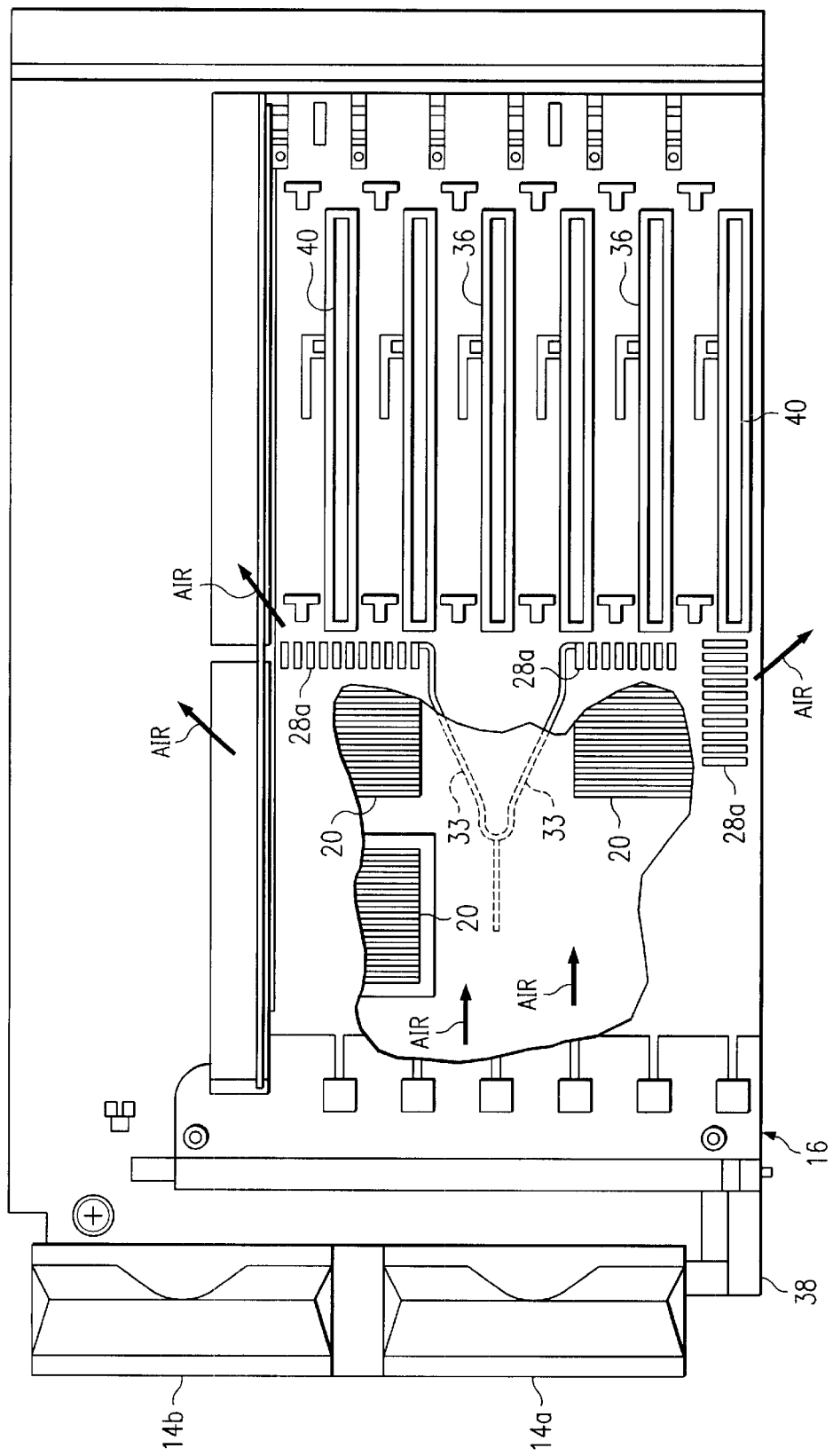
FIG. 7 is a top view taken along the line 7—7 of FIG. 6.

The computer server chassis 10, FIGS. 6 and 7, includes a motherboard 38 mounted therein. The baseplate 24 of shroud 16 is mounted adjacent the motherboard 38. A plurality of card connectors 40 are mounted on the motherboard 38 and extend through the connector slots 36. The plurality of the SCSI chips 20 are mounted on the motherboard 38 adjacent the first planar section 24a. At least one fan 14a, and preferable another fan 14b, is mounted in chassis 10 adjacent the first planar section 24a. A plurality of the PCI cards 22, FIGS. 3 and 6, are mounted between each of the dividers 26.

In operation, FIGS. 1–7, the shroud structure 16 acts as an air manifold, which also acts as a mechanical shield, or insulator, especially with respect to hotplugging requirements. Moreover, the dishrack base 24 is a duct or shroud which gathers enough airflow, via the maximum cross sectional area available normal to airflow, especially between the lower edge of the PCI cards 22 and the top of the motherboard 38. This form of ducting can extend beyond the PCI area in which case, the entire motherboard 38 can be protected as Well as having it's various components provided with the optimal volumetric velocity of air. This may include diverting, or leaking airflow to avoid the situation where critical components receive preheated air. As well, this shroud structure 16 could limit preheated air from other computer components, such as CPUs 11, being blown across the motherboard devices. Motherboard devices might include IC's with or without heatsinks, transistors, or circuit cards such as VRMs, etc. Hooks 50, FIG. 6, engage slots 51, FIG. 3, to attach the shroud 16 to the chassis 10.

The dishrack base 24, FIGS. 1–7, acts as an air manifold that gathers up incoming air from the front two system fans 14a and 14b. A front scoop 44, in conjunction with a fan flap 46, brings air between the motherboard 38 and the dishrack base 24 and then vents the air to the PCI cards 22. In order to allow ventilation through the dishrack base 24, the ventilated ramp 28 has been placed between the heatsinks and the PCI cards. The slots 28a are sufficiently fine to prevent any small object (>2 mm) from falling through, but extensive enough to allow plenty of airflow. Because there is a continuous barrier between the PCI cards 22 and the motherboard 38, the PCI cards 22 cannot preheat, or share their airflow into the SCSI controller chips 20 or any other planar devices for that matter. The dishrack shroud 16 is attached to the motherboard 38 via the same hooks 50 that locate the motherboard 38.

As can be seen, the principal advantages of these embodiments are that this shroud provides a means to cool the SCSI controller chips which might otherwise be impossible. Also, the dishrack shroud provides more extensive motherboard protection and insulation than prior art dishracks. This shroud also provides means for more precisely cooling motherboard components while at the same time protecting the motherboard and it's devices from possible shorting. As the devices become hotter and use more power, these two functions become more important. As the different devices and components generate more heat, the threat of overheating by virtue of neighboring devices becomes greater and a comprehensive airflow solution becomes mandatory. Also, as hotplugging becomes more and more of a requirement throughout the computer chassis, it becomes critical that the various components and devices are mechanically shielded, or insulated, especially because of the fact that the amount of electrical power has grown to the limits of OSHA regulations. In other words, although the voltages have dropped, the maximum current supplies have risen enormously and must not be exposed to the customer under normal service operations.

Although illustrative embodiments have been shown and described, a wide range of modification, change and substitution is contemplated in the foregoing disclosure and in some instances, some features of the embodiment may be employed without a corresponding use of other features. Accordingly, it is appropriate that the appended claims be construed broadly and in a manner consistent with the scope of the embodiments disclosed herein.

What is claimed is:

1. An apparatus comprising:
   a baseplate;
   a plurality of dividers mounted on the baseplate and extending therefrom, the dividers being substantially equally spaced apart in substantially parallel relationship;
   the baseplate including a first substantially planar section and a second substantially planar section, the first and second planar sections extending along respective first and second planes, the first plane being spaced apart from the second plane; and
   a ventilated ramp extending between the first and second planar sections, the ramp directing an airflow path from a first side of the first planar section to a second side of the second planar section.

2. The apparatus as defined in claim 1 wherein the second planar section includes a plurality of elongated, substantially parallel connector slots formed therein.

3. The apparatus as defined in claim 2 wherein the first planar section includes an enlarged planar area free of any openings formed therein, whereby the first planar section forms an air manifold.

4. The apparatus as defined in claim 3 wherein the ventilated ramp is an inclined section interconnecting the first and second planar sections and having a plurality of openings formed therein.

5. A computer comprising:
   a chassis;
   a motherboard mounted in the chassis;
   a baseplate mounted adjacent the motherboard;
   a plurality of dividers mounted on the baseplate and extending therefrom, the dividers being substantially equally spaced apart in substantially parallel relationship;
   the baseplate including a first substantially planar section and a second substantially planar section, the first and second planar sections extending along respective first and second planes, the first plane being spaced apart from the second plane; and
   a ventilated ramp extending between the first and second planar sections, the ramp directing an airflow path from a first side of the first planar section to a second side of the second planar section.

6. The computer as defined in claim 5 wherein the second planar section includes a plurality of elongated, substantially parallel connector slots formed therein.

7. The computer as defined in claim 6 wherein the first planar section includes an enlarged planar area free of any openings formed therein, whereby the first planar section forms an air manifold.

8. The computer as defined in claim 6 further comprising:
   a plurality of card connectors mounted on the motherboard and extending through the connector slots.

9. The computer as defined in claim 7 wherein the ventilated ramp is an inclined section interconnecting the first and second planar sections and having a plurality of openings formed therein.

10. The computer as defined in claim 8 further comprising:
   a plurality of chips mounted on the motherboard adjacent the first planar section.

11. The computer as defined in claim 10 further comprising:
   at least one fan mounted on the chassis adjacent the first planar section.

12. The computer as defined in claim 11 further comprising:
   a deflector between the fan and the first planar section, whereby the airflow path extends from the fan, across the chips, through the openings in the ventilated ramp and adjacent the card connectors.

13. A computer system comprising:
   a chassis having a motherboard mounted therein;
   a CPU mounted in the chassis;
   a baseplate mounted adjacent the motherboard;
   a plurality of dividers mounted on the baseplate and extending therefrom, the dividers being substantially equally spaced apart in substantially parallel relationship;
   the baseplate including a first substantially planar section and a second substantially planar section, the first and second planar sections extending along respective first and second planes, the first plane being spaced apart from the second plane; and
   a ventilated ramp extending between the first and second planar sections, the ramp directing an airflow path from a first side of the first planar section to a second side of the second planar section.

14. The computer system as defined in claim 13 wherein the second planar section includes a plurality of elongated, substantially parallel connector slots formed therein.

15. The computer system as defined in claim 14 wherein the first planar section includes an enlarged planar area free of any openings formed therein, whereby the first planar section forms an air manifold.

16. The computer as defined in claim 14 further comprising:
   a plurality of card connectors mounted on the motherboard and extending through the connector slots.

17. The computer system as defined in claim 15 wherein the ventilated ramp is an inclined section interconnecting the first and second planar sections and having a plurality of openings formed therein.

18. The computer as defined in claim 16 further comprising:
   a plurality of chips mounted on the motherboard adjacent the first planar section.

19. The computer as defined in claim 18 further comprising:
   at least one fan mounted on the chassis adjacent the first planar section.

20. The computer as defined in claim 19 further comprising:
   a deflector between the fan and the first planar section, whereby the airflow path extends from the fan, across the chips, through the openings in the ventilated ramp and adjacent the card connectors.

* * * * *